(12) United States Patent
Sun et al.

(10) Patent No.: US 7,345,610 B2
(45) Date of Patent: Mar. 18, 2008

(54) HIGH SPEED DIGITAL-TO-ANALOG CONVERTER

(75) Inventors: Kae-Oh Sun, Madison, WI (US); Daniel Warren van der Weide, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 11/451,205

(22) Filed: Jun. 12, 2006

(65) Prior Publication Data

US 2007/0285292 A1 Dec. 13, 2007

(51) Int. Cl.
*H03M 1/66* (2006.01)

(52) U.S. Cl. .................................... 341/144; 341/147

(58) Field of Classification Search ......... 341/125–170
See application file for complete search history.

(56) References Cited

U.S. PATENT DOCUMENTS

| | | | |
|---|---|---|---|
| 6,304,201 B1 | 10/2001 | Moreland et al. | |
| 6,359,577 B1 * | 3/2002 | Weigel | 341/147 |
| 6,535,666 B1 | 3/2003 | Dogan et al. | |
| 2004/0080444 A1 | 4/2004 | Meyers et al. | |
| 2004/0095266 A1 | 5/2004 | Kernahan et al. | |
| 2005/0200508 A1 | 9/2005 | Hitko | |
| 2005/0225472 A1 | 10/2005 | Schoner | |

OTHER PUBLICATIONS

Bruce, J. W., "Nyquist-rate digital-to-analog converter architectures", IEEE Potentials, Aug./Sep. 2001.

Cohn, Seymour B., "A Class of Broadband Three-Port TEM-Mode Hybrids", IEEE Transactions on Microwave Theory and Techniques, vol. MTT-16, No. 2., Feb. 1968.

Li, et al., "CAD/CAE Design of an Improved, Wideband Wilkinson Power Divider", Microwave Journal, pp. 125-126, 128, 132,134, Nov. 1984.

Mercer, Douglas, "A 16-b D/A Converter with Increased Spurious Free Dynamic Range", IEEE Journal of Solid-State Circuits, vol. 29, No. 10. pp. 1180-1185, Oct. 1994.

* cited by examiner

*Primary Examiner*—Lam T. Mai
(74) *Attorney, Agent, or Firm*—Foley & Lardner LLP

(57) ABSTRACT

A digital-to-analog converter supporting high speed operation is defined. The converter includes a plurality of sampler circuits in electrical communication with a digital signal source and a summation circuit in electrical communication with the plurality of sampler circuits. A sampler circuit of the plurality of sampler circuits is adapted to sample a bit of a plurality of bits from the digital signal source with a half-sinusoidal signal forming a sampled signal. The sampler may include a plurality of diodes and a sinusoidal signal source. The sinusoidal signal source toggles the plurality of diodes on and off thereby forming the sampled signal at a sampler output port. The summation circuit is adapted to combine the sampled signal from each of the plurality of sampler circuits to form an analog signal portion representative of the plurality of bits. Exemplary summation circuits include an R-2R resistance ladder and a Wilkinson power combiner.

22 Claims, 16 Drawing Sheets

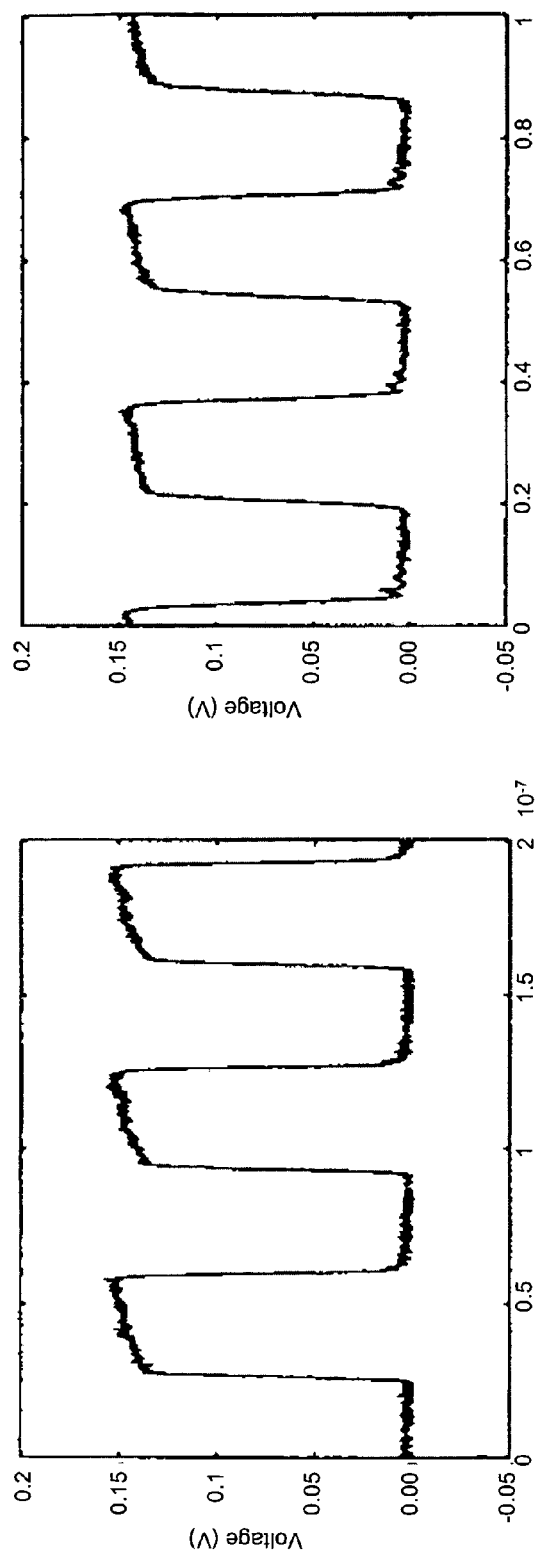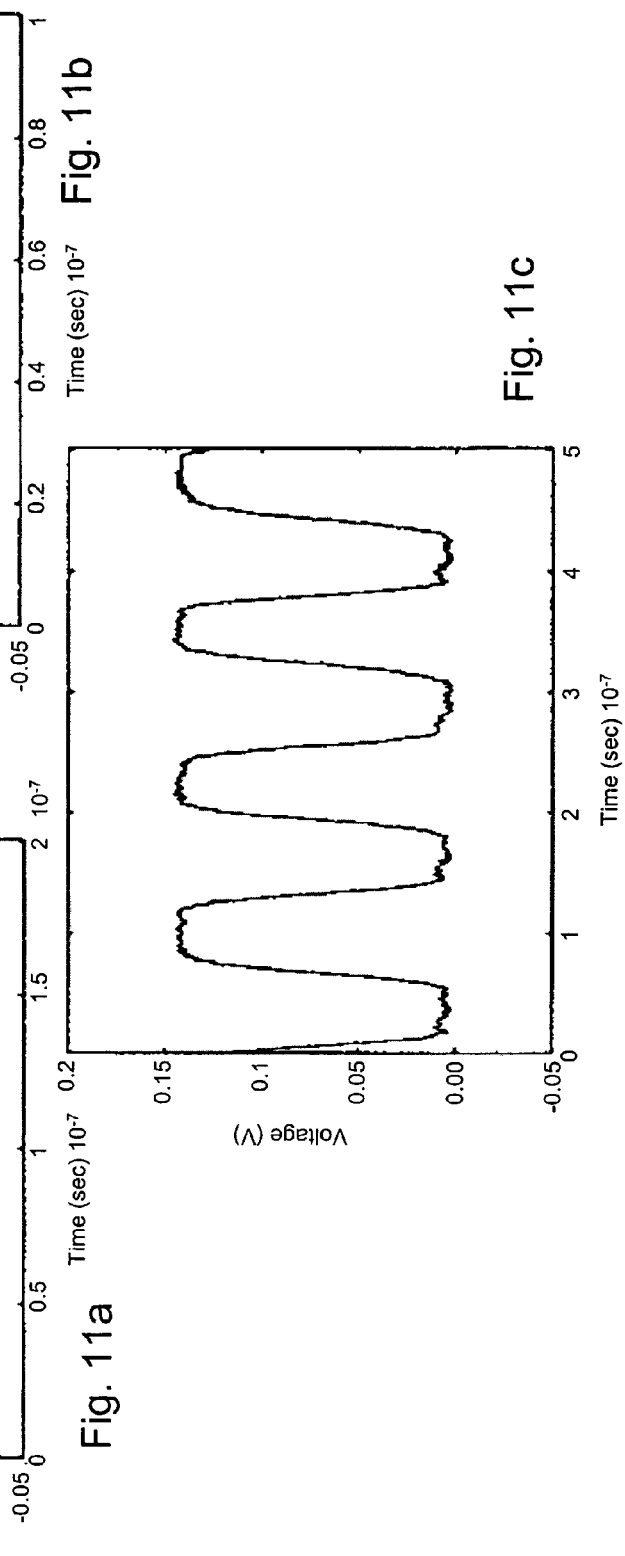

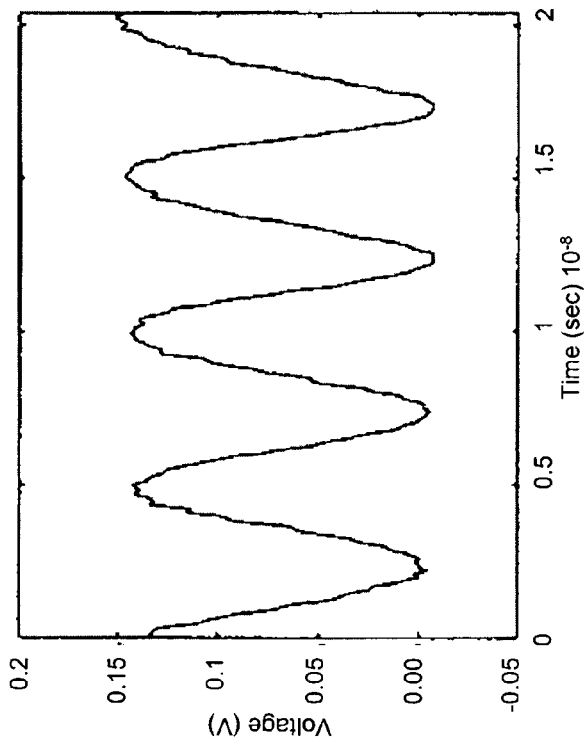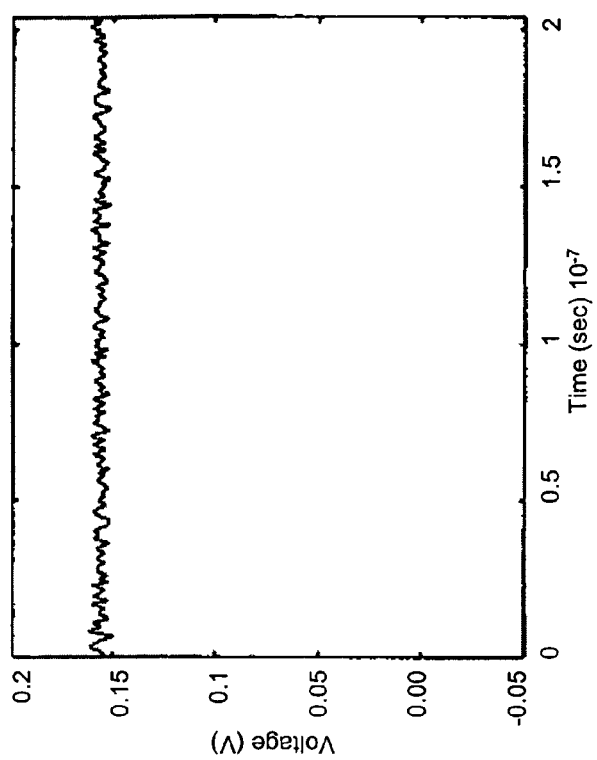

HIGH SPEED DIGITAL-TO-ANALOG CONVERTER

REFERENCE TO GOVERNMENT RIGHTS

This invention was made with United States government support awarded by the following agency: USAF/AFOSR F49620-03-1-0420. The United States government has certain rights in this invention.

FIELD OF THE INVENTION

The subject of the disclosure relates generally to digital-to-analog converters. More specifically, the disclosure relates to a high speed digital-to-analog converter that is scalable to support different numbers of bits and frequencies.

BACKGROUND OF THE INVENTION

A wide variety of electronic devices rely on digital-to-analog converters (DACs), which convert a digital signal defined by a number of bits to an analog signal. DACs can be classified into two different categories: Nyquist rate DACs and oversampling DACs. Usually, Nyquist-rate DACs can produce higher frequency analog outputs, but use more complicated hardware. On the other hand, oversampling DACs have simpler hardware, but output frequencies of the generated analog signal are lower. One advantage of oversampling DACs is that they have a better signal-to-noise ratio, compared to Nyquist-rate DACs. High speed DACs have many applications in direct digital synthesis and software defined radio. Nyquist rate DACs typically convert digital data into analog signals by switching and adding the digital data. By toggling the switches according to input data, current or voltage is modulated. Conventionally, DACs have been made based on digital circuits, such as decoders or flip-flops for switching. Switches used for DACs are usually made with metal-oxide semiconductor field-effect transistors (MOSFETs) or bipolar junction transistors (BJTs). Use of both types of switches to support high speed operation is limited due to the severe switching speed limitations inherent in their intrinsic operating characteristics, such as carrier recombination time or transit delay. Generally, current mode switching is preferred for high speed DACs. However, due to the limited speeds of the MOSFETs and BJTs, it is difficult to increase the operating speed of the switches even using current mode switching.

In some DAC designs, the digital input data received at the DAC toggles switches, and the resulting signals are added to construct analog signal representations. Using this method, as the operating speed of the DAC becomes very high, the line length between components cannot be ignored. Generally, impedance matching between the digital data source and the sampler is poor. When the phase delay along the interconnection line is not negligible, the wave reflection should be small to avoid signal shape corruption. Unfortunately, digital data contains many harmonics to maintain their shape, and impedance matching used for reducing the wave reflection should be ultra-broadband in response. It is not easy, however, to construct ultra-broadband impedance matching circuits. A possible solution to the impedance mismatching problem is to insert buffer amplifiers whose input and output impedances are matched to the line impedances. Unfortunately, this is difficult when the input frequency of the digital signal is very high, because the bandwidth of the buffer amplifiers should cover a range from DC to several harmonic frequencies higher. Thus, what is needed is a DAC that supports high speed operation while overcoming these limitations. What is further needed is a DAC that is scalable to support the conversion of different numbers of bits and is scalable to support different frequencies.

SUMMARY OF THE INVENTION

Exemplary structures for implementing a very high speed DAC based on microwave circuit principles is provided. Exemplary embodiments include a sampler and a summer in combination. A large impedance mismatching that may occur between the sampler and summer is resolved by establishing sufficient input impedance matching at the samplers, which results in a very small amount of power returning back to the summer. Because Schottky diodes are one of the fastest switching devices available and can be made to have a very small input capacitance and resistance, the sampler circuits preferably utilize Schottky diodes to provide sampling of the digital signals. The summer may include for example, an R-2R resistive ladder network or a Wilkinson power combiner. The provided exemplary DAC designs are scalable in frequency and resolution.

In an exemplary embodiment, a digital-to-analog converter is provided. The digital-to-analog converter includes, but is not limited to, a plurality of sampler circuits in electrical communication with a digital signal source and a summation circuit in electrical communication with the plurality of sampler circuits. A sampler circuit of the plurality of sampler circuits is adapted to sample a bit of a plurality of bits from the digital signal source with a half-sinusoidal signal thereby forming a sampled signal. The summation circuit is adapted to combine the sampled signal from each of the plurality of sampler circuits thereby forming an analog signal portion representative of the plurality of bits.

In another exemplary embodiment, a method of converting a digital signal to an analog signal is provided. The method includes, but is not limited to, receiving a plurality of bits from a digital signal source, sampling the plurality of bits with a half-sinusoidal signal at a plurality of sampler circuits thereby forming a plurality of sampled signals, and summing the plurality of sampled signals using a summation circuit.

In yet another exemplary embodiment, a discrete digital synthesizer is provided. The synthesizer includes, but is not limited to, a digital signal source, a plurality of sampler circuits in electrical communication with the digital signal source, a summation circuit in electrical communication with the plurality of sampler circuits, and an analog signal receiver in electrical communication with the summation circuit to receive the analog signal portion. A sampler circuit of the plurality of sampler circuits is adapted to sample a bit of a plurality of bits from the digital signal source with a half-sinusoidal signal thereby forming a sampled signal. The summation circuit is adapted to combine the sampled signal from each of the plurality of sampler circuits thereby forming an analog signal portion representative of the plurality of bits.

BRIEF DESCRIPTION OF THE DRAWINGS

Exemplary embodiments of the invention will hereafter be described with reference to the accompanying drawings, wherein like numerals will denote like elements.

FIGS. 11a-11h are graphs illustrating a variety of waveforms generated by the first DAC design of FIG. 10.

DETAILED DESCRIPTION OF THE EXEMPLARY EMBODIMENTS

Figure 1:
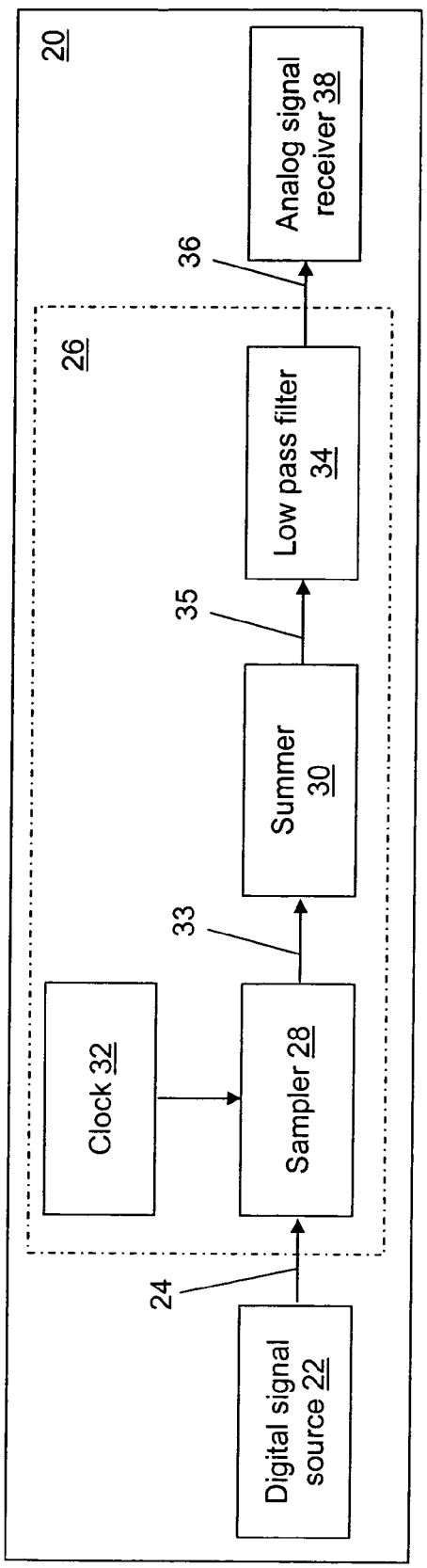
FIG. 1 depicts a discrete digital synthesizer in accordance with an exemplary embodiment.

With reference to FIG. 1, a discrete digital synthesizer 20 is shown. Discrete digital synthesizer 20 may include a digital signal source 22, a sampler 28, a summer 30, a clock 32, a low pass filter 34, and an analog signal receiver 38. Different and additional components may be utilized by discrete digital synthesizer 20. For example, discrete digital synthesizer 20 may include one or more power source, buffer, limiting amplifier, etc. Digital signal source 22 may be a variety of devices including a digital computer, a digital signal processor, etc. as known to those skilled in the art both now and in the future. Digital signal source 22 provides a plurality of bits 24 to sampler 28. Clock 32 provides a consistent timing source for the processing of the plurality of bits 24 received from digital signal source 22. Sampler 28 samples the plurality of bits with a half-sinusoidal signal and forms a plurality of sampled signals 33. Summer 30 receives and sums the plurality of sampled signals 33 forming an analog signal portion 35 representative of the plurality of bits 24. Low pass filter 34 receives analog signal portion 35 formed by summer 30 and limits the bandwidth of an analog signal output 36 propagated to analog signal receiver 38. Analog signal receiver 38 may be a variety of devices including a radar or communications antenna as known to those skilled in the art both now and in the future.

Figure 2:
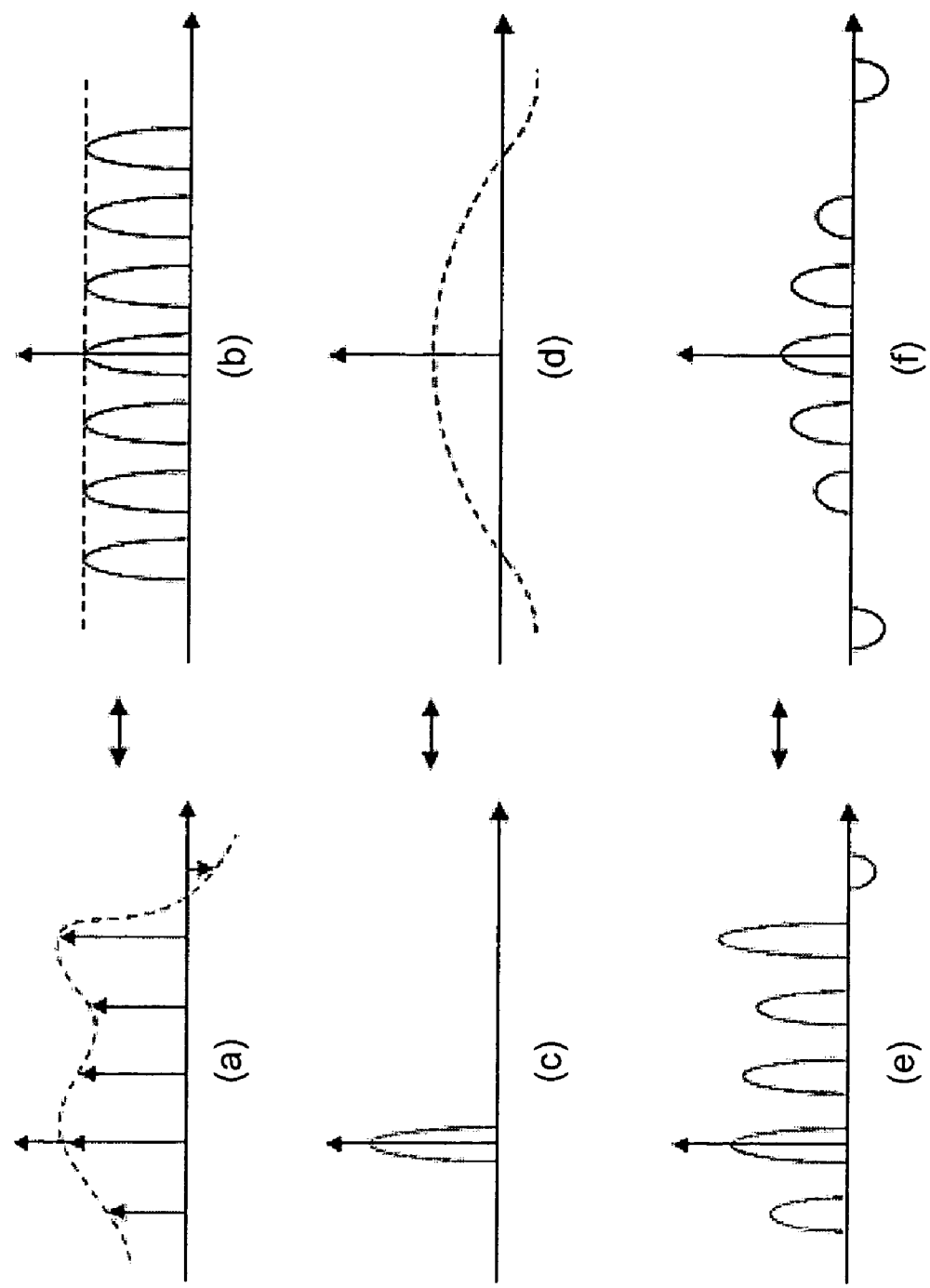
FIG. 2 illustrates a time domain and a frequency domain expression of a sampled signal in accordance with an exemplary embodiment.

FIG. 2 illustrates a time domain and a frequency domain expression of a sampled signal in accordance with an exemplary embodiment. Ideally, an analog signal can be sampled by impulses with zero width and infinite amplitude. Practical sampling signals, however, have a non-zero width and finite amplitude. For example, when sampling an analog signal f(t) using a series of half-sinusoidal signals, the sampled signal is the convolution of $f_s(t)$ illustrated in FIG. 2(a) in the time domain and in FIG. 2(b) in the frequency domain, and q(t) illustrated in FIG. 2(c) in the time domain and in FIG. 2(d) in the frequency domain. The resulting sampled signal is illustrated in FIG. 2(e) in the time domain and in FIG. 2(f) in the frequency domain.

$$f_s(t) * q(t) = \sum_{n=-\infty}^{\infty} f(nT)\delta(t - nT) * q(t) \qquad (1)$$

$$= \sum_{n=-\infty}^{\infty} f(nT)q(t - nT)$$

$$F_s(w)Q(W) = \frac{1}{T} \sum_{n=-\infty}^{\infty} F\left(w - \frac{n2\pi}{T}\right)Q(w) \qquad (2)$$

Figure 3:
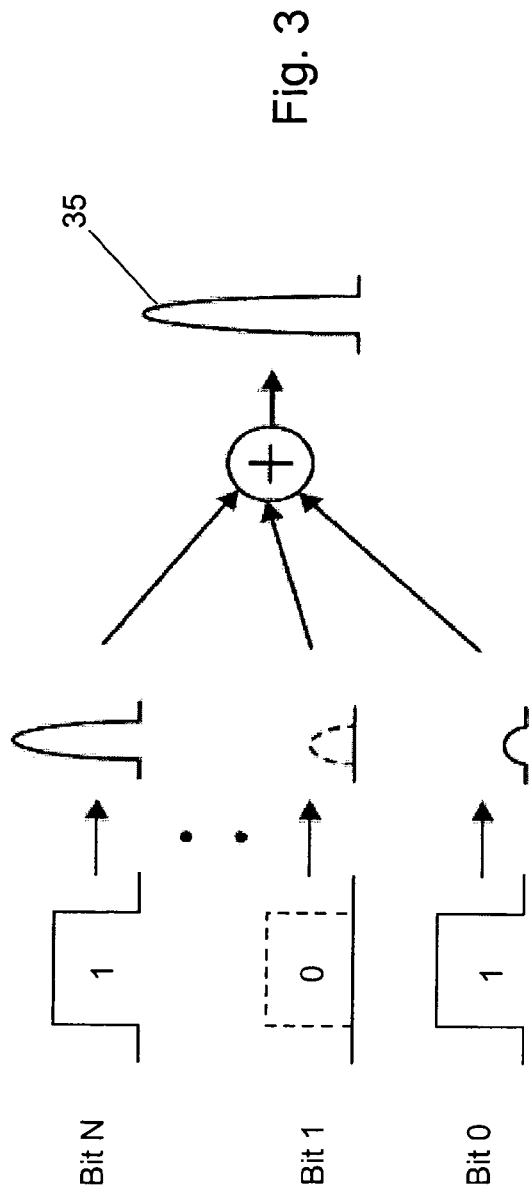
FIG. 3 is a diagram illustrating a data summation concept using a half-sinusoidal sampling signal in accordance with an exemplary embodiment.

As indicated in Equations (1) and (2) above, the sampled signal $f_s(t)*q(t)$ contains the frequency information of f(t) at every multiple time of $$w_0 = \frac{2\pi}{T}$$

in the frequency domain, as illustrated in FIG. 2(f). Therefore, if $f_s(t)*q(t)$ as illustrated in FIG. 2(e), can be generated from digital data, it is possible to retrieve f(t). In order to avoid aliasing, the sampling frequency of f(t) should be larger than the Nyquist sampling rate. The signal in FIG. 2(e) can be obtained by sampling each digital bit using a half-sinusoidal signal and adding the results having different magnitude scales, as shown in FIG. 3. N-bits are sampled and summed to form analog signal portion 35. By sampling a digital word using half-sinusoidal signals before all of the bits are added, non-return to zero (NRZ) patterns are converted into return to zero (RZ) patterns. NRZ-to-RZ conversion provides an advantage with regard to problems that may arise from imperfect timing synchronization.

Figure 4:
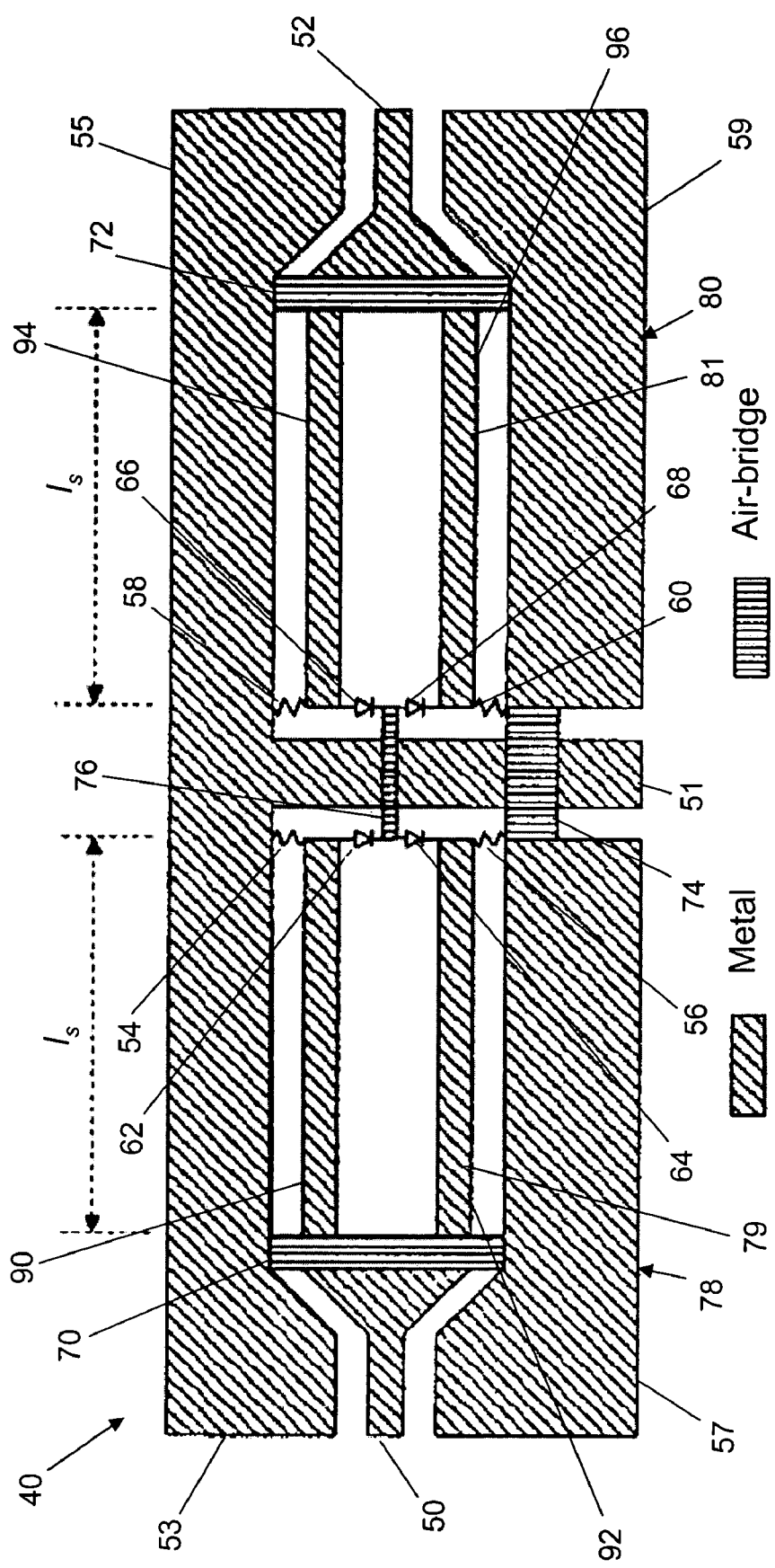
FIG. 4 is a detailed layout of a first sampler circuit design in accordance with a first exemplary embodiment.

With reference to FIG. 4, a detailed layout of a first sampler circuit 40 in accordance with a first exemplary embodiment of sampler 28 is shown. First sampler circuit 40 includes an input port 50, a sinusoidal signal source 51, a sampler output port 52, a plurality of diodes, a plurality of resistors, a first coplanar wave guide 78, and a second coplanar wave guide 80.

In the exemplary embodiment of FIG. 4, first coplanar wave guide (CPW) 78 and second CPW 80 are double center line CPW structures that provide good transmission when the plurality of diodes are on and good impedance matching when the plurality of diodes are off. First CPW 78 is connected between input port 50 and the plurality of diodes. First CPW 78 includes a first conductor 53, a second conductor 57, and a double center line 79. Double center line 79 includes a third conductor 90 and a fourth conductor 92. A first air bridge 70 provides a connection point between first conductor 53, second conductor 57, and double center line 79 of first CPW 78 and input port 50. Second CPW 80 is connected between the plurality of diodes and sampler output port 52. Second CPW 80 includes a first conductor 55, a second conductor 59, and a double center line 81. Double center line 81 includes a third conductor 94 and a fourth conductor 96. A second air bridge 72 provides a connection point between first conductor 55, second conductor 59, and double center line 81 of second CPW 80 and sampler output port 52. A third air bridge 74 provides a connection between second conductor 57 of first CPW 78 and second conductor 57 of second CPW 80. Double center line 79 of first CPW 78 and double center line 81 of second CPW 80 have a common length $l_s$.

The plurality of resistors include a first resistor 54, a second resistor 56, a third resistor 58, and a fourth resistor 60. First resistor 54 connects between first conductor 53 and double center line 79 of first CPW 78. Second resistor 56 connects between second conductor 57 and double center line 79 of first CPW 78. Third resistor 58 connects between first conductor 53 and double center line 79 of second CPW 80. Fourth resistor 60 connects between second conductor 57 and double center line 79 of second CPW 80. The resistance of each of the plurality of resistors may be denoted as R.

The plurality of diodes includes a first diode 62, a second diode 64, a third diode 66, and a fourth diode 68. First diode 62 and second diode 64 connect in series between third conductor 90 and fourth conductor 92 of double center line 79 of first CPW 78. Third diode 66 and fourth diode 68 connect in series between third conductor 94 and fourth conductor 96 of double center line 81 of second CPW 80. A fourth air bridge 76 provides a connection between the plurality of diodes. In an exemplary embodiment, the plurality of diodes 62, 64, 66, 68 may be Schottky diodes. In another exemplary embodiment, the plurality of diodes 62, 64, 66, 68 may be GaAs Schottky diodes.

Figure 5:
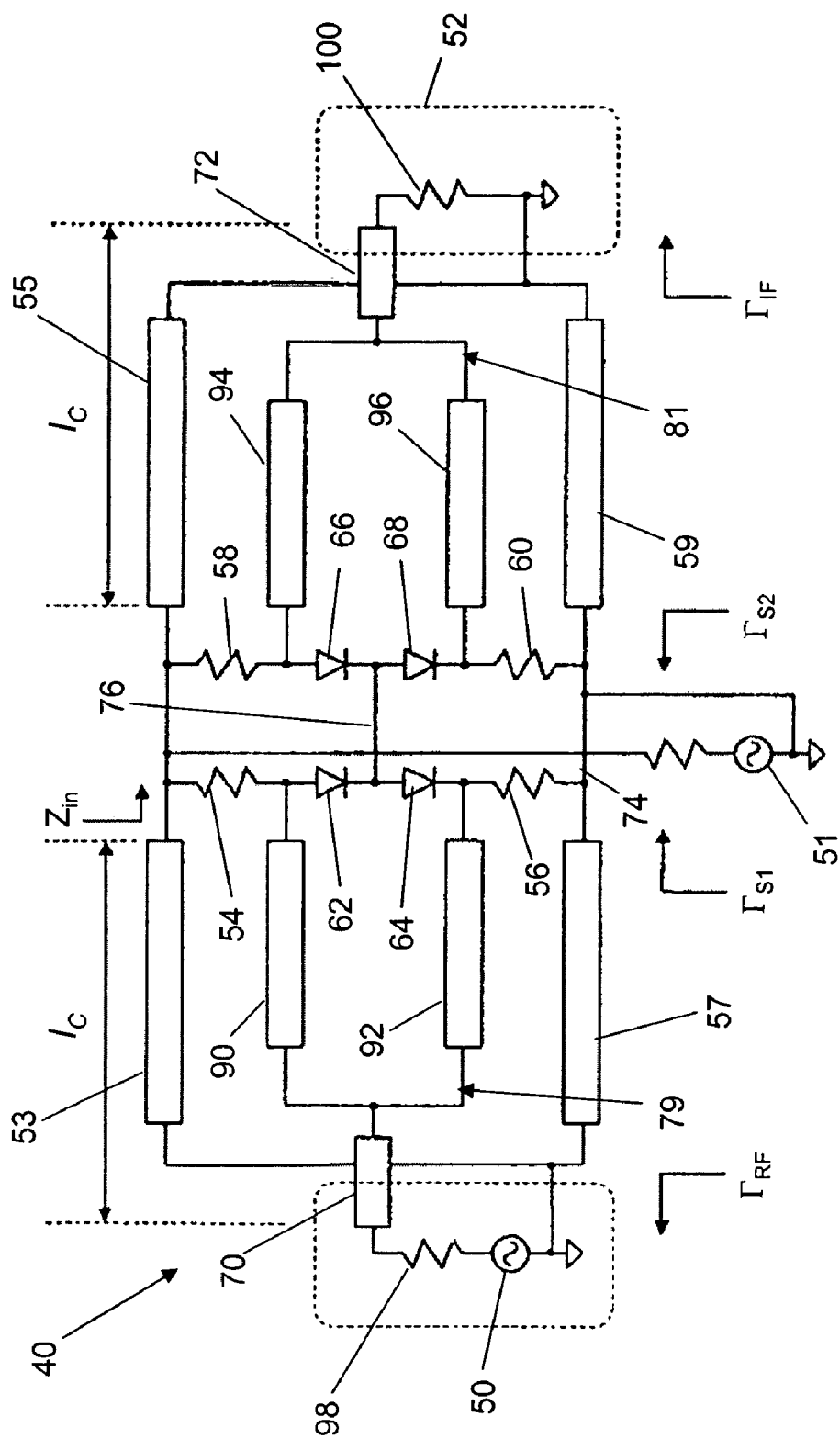
FIG. 5 is a schematic diagram of the first sampler circuit design of FIG. 4 in accordance with the first exemplary embodiment.

With reference to FIG. 5, a schematic diagram of first sampler circuit 40 is shown. First sampler circuit 40 further includes a first impedance 98, denoted as $Z_0$, at input port 50, and a second impedance 100, denoted as $Z_{IF}$, at sampler output port 52. A sinusoidal signal provided at sinusoidal signal source 51 toggles the plurality of diodes 62, 64, 66, 68 on and off. In the exemplary embodiment of FIGS. 4 and 5, a positive signal value provided by sinusoidal signal source 51 turns on all of the plurality of diodes 62, 64, 66, 68. When the plurality of diodes 62, 64, 66, 68 are on, the radio frequency (RF) signal received at input port 50 is transferred to sampler output port 52, which is at an intermediate frequency (IF). Assuming that the plurality of diodes 62, 64, 66, 68 act as perfect switches, their impedance is zero when they are turned off and infinite when they are turned on. As a result, if first impedance 98 and second impedance 100, are equal, i.e., $Z_0 = Z_{IF}$, the input impedance $Z_{in,ON}$ is $$\frac{R}{4} \mid \mid Z_0.$$

Conversely, a negative signal value provided by sinusoidal signal source 51 turns off all of the plurality of diodes 62, 64, 66, 68, and no signal is transferred from input port 50 to sampler output port 52. The input impedance $Z_{in,OFF}$ is $$\frac{R}{2}.$$

If the resistance R is equal to $2Z_0$, the reflection coefficients $\Gamma_{S1}$ and $\Gamma_{S2}$ at the sinusoidal signal source 51 are zero with the plurality of diodes 62, 64, 66, 68 off.

The digital signal originates from digital circuits. In general, the impedance matching may not be good. Impedance matching at sampler output port 52 may not be good either because sampler output port 52 is connected to summer 30, which includes a signal summation circuit, such as an R-2R resistance ladder, or a resistor-string whose impedance is not matched to the line impedance of first sampler circuit 40. As a result, the wave reflection at input port 50, $\Gamma_{RF}$ and at sampler output port 52, $\Gamma_{IF}$, are not zero. As a result, some signal power is reflected back to the plurality of diodes 62, 64, 66, 68. The reflected signal has no effect on the sampling performance as long as it arrives at the diodes when they are off. Because the impedance is matched to the characteristic impedance $Z_0$ of the transmission line when the diodes are off, no signal goes back to input port 50 or sampler output port 52. Therefore, the length of the CPW line, denoted $l_C$ should be an odd multiple of $$\frac{\lambda_{CPW}}{4}.$$

In this case, $\lambda_{CPW}$ is the wave length of the CPW line used for the RF and IF signals.

Figure 6:
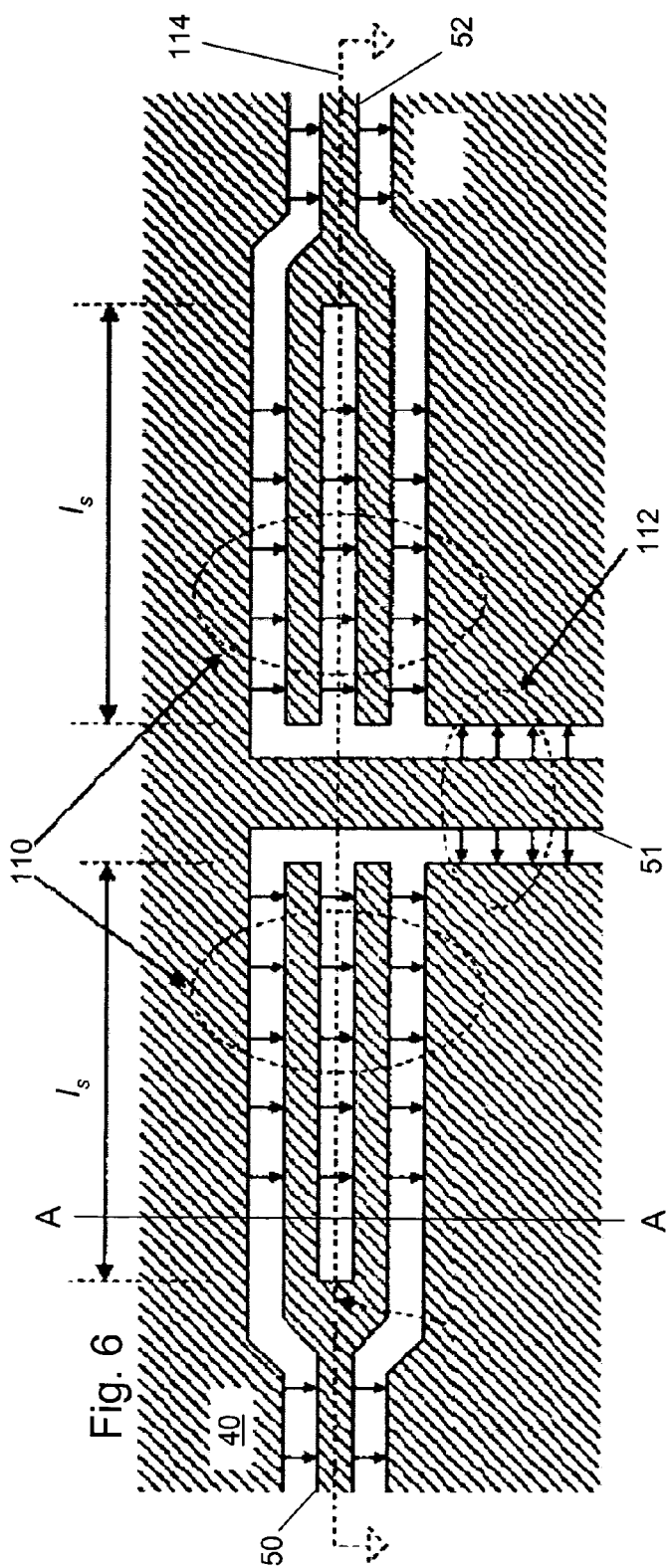
FIG. 6 is the detailed layout of the first sampler circuit design of FIG. 4 illustrating a wave transition from an unbalanced mode to a balanced mode in accordance with an exemplary embodiment.

With reference to FIG. 6, the mode transition of the local oscillator (LO) sinusoidal signal is described. For simplicity, the plurality of diodes, the plurality of resistors, and the plurality of air-bridges are not shown. When a LO signal excites a CPW line, it propagates in an unbalanced mode 112 (CPW mode) until it meets a CPW-slotline junction. After meeting a CPW-slotline junction, the LO signal propagates in a balanced mode 110 (slotline mode). Due to the characteristics of the balanced signal, a virtual ground 114 is formed in the middle of the double line CPW. Ideally, the LO-RF or LO-IF isolation should be infinite. On the other hand, the balanced LO signal toggles the plurality of diodes when they are positioned between the center lines of the CPW. The RF and IF signals only have an unbalanced mode (not shown) because the signals propagate along the double line CPW, as they do for normal CPW lines, and that mode determines the line length $l_C$ of FIG. 5.

Figure 7:
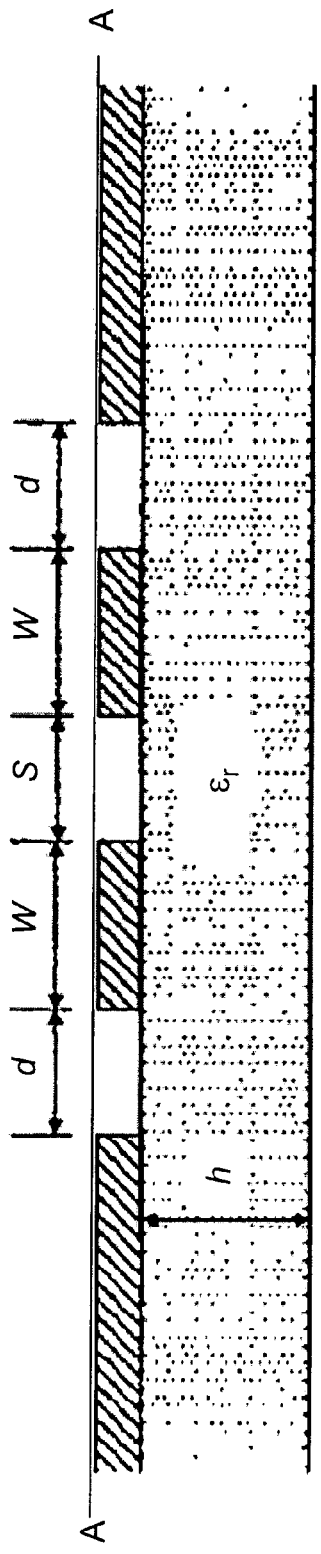
FIG. 7 is a cross-sectional view of the detailed layout of the first sampler circuit design of FIG. 4 in accordance with the first exemplary embodiment.

The characteristic impedance of first CPW 78 and second CPW 80 are a function of the gap between third conductor 90 and fourth conductor 92 of first CPW 78 and between third conductor 94 and fourth conductor 96 of second CPW 80. The characteristic impedance $Z_0$ can be calculated by considering it as one half of the even mode characteristic impedance $Z_{0,e}$ of a coupled CPW. A phase velocity can be obtained in the same way. The most common method employed to analyze CPW geometry is to use a conformal mapping using a Schwartz-Christoffel transformation. The phase velocity and the wave length can be obtained from the effective dielectric constant. With reference to FIG. 7, the geometry of a coupled CPW is provided where S is the width of the center gap between third conductors 90, 94 and fourth conductors 92, 96, W is the width of third conductors 90, 94 and the width of fourth conductors 92, 96, d is the width of the gap between first conductors 53, 55 and third conductors 90, 94 and between second conductors 57, 59 and fourth conductors 92, 96, and h is the height of the dielectric layer. The even mode effective dielectric constant $\in_{\mathit{eff},e}$ and the characteristic impedance $Z_{0,e}$ are $$\varepsilon_{\mathit{eff},e} = 1 + 0.5(\varepsilon_r - 1)\frac{K(\Psi k_2)K'(\delta k_1)}{K'(\Psi k_2)K(\delta k_1)} \quad (3)$$

$$Z_{0,e} = \frac{60\pi}{\sqrt{\varepsilon_{\mathit{eff},e}}} \frac{K'(\delta k_1)}{K(\delta k_1)} \quad (4)$$

$$\delta = \sqrt{\frac{1 - r_1^2}{1 - k_1^2 r_1^2}} \quad (5)$$

$$r_1 = \frac{S}{S + 2W}, k_1 = \frac{S + 2W}{S + 2W + 2d} \quad (6)$$

$$\Psi = \sqrt{\frac{1 - r_2^2}{1 - k_2^2 r_2^2}} \quad (7)$$

$$r_2 = \frac{\sinh\left(\frac{\pi S}{4h}\right)}{\sinh\left(\left(\frac{\pi}{2h}\right)\left(\frac{S}{2} + W\right)\right)} \quad (8)$$

$$k_2 = \frac{\sinh\left(\frac{\pi}{2h}\right)\left(\frac{S}{2} + W\right)}{\sinh\left(\left(\frac{\pi}{2h}\right)\left(\frac{S}{2} + W + d\right)\right)} \quad (9)$$

K(x) and K'(x) are the complete elliptic integrals of the first kind and are related as follows:

$$K'(x) = K(x') \quad (10)$$

$$x' = \sqrt{1 - x^2} \quad (11)$$

Figure 8:
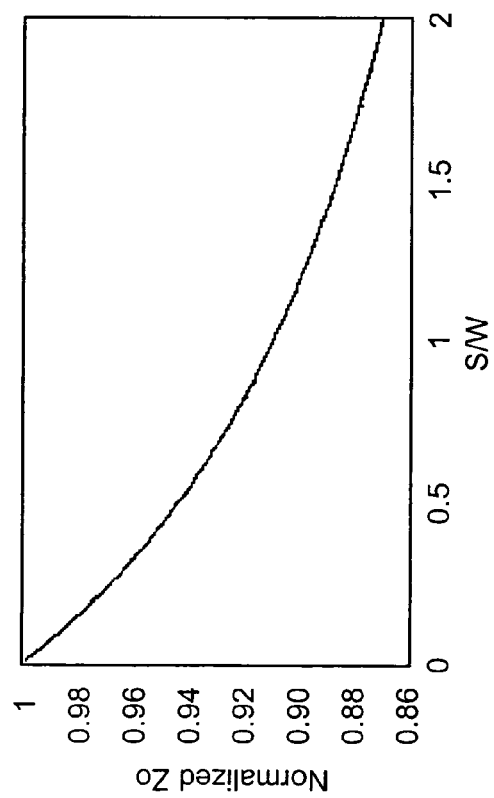
FIG. 8 is a graph indicating the variation in characteristic impedance as a function of the center gap of a double line coplanar wave guide used in the first sampler circuit design of FIG. 4.

As a result, the characteristic impedance of the double line CPW is half of Equation (4), as shown below, with the resulting characteristic impedance variation of the double line CPW illustrated in FIG. 8 as a function of the center gap S.

$$Z_0 = \frac{Z_{0,e}}{2} \quad (12)$$

Figure 9:
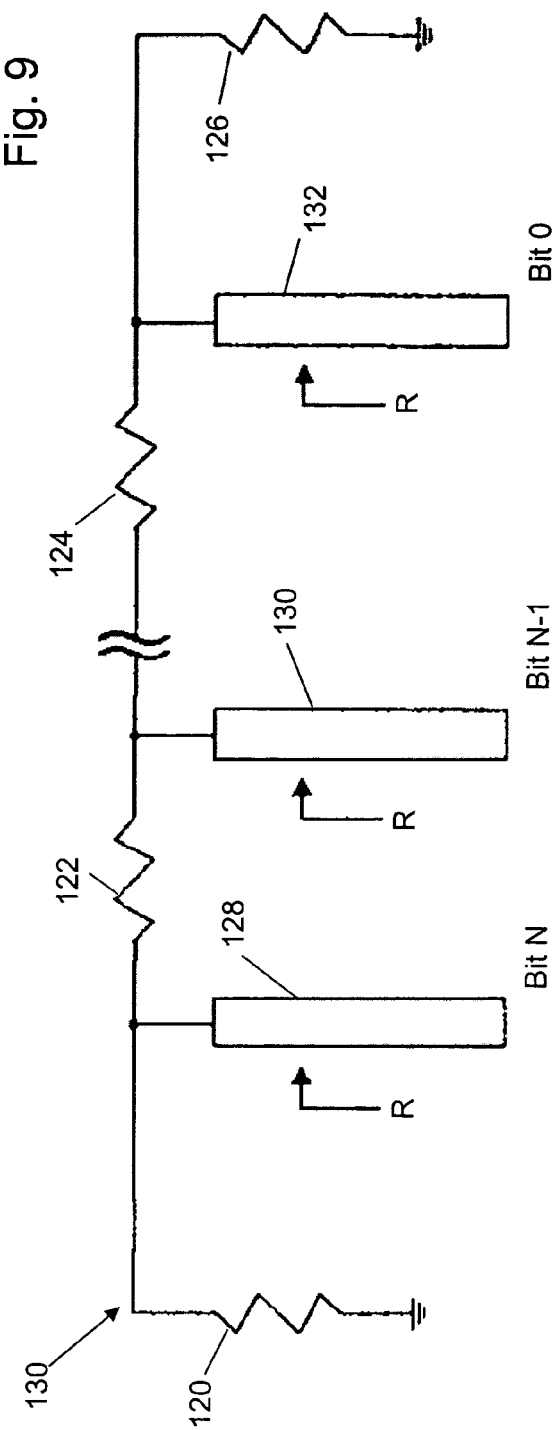
FIG. 9 is a schematic diagram of a first summation circuit design in accordance with a first exemplary embodiment.

With reference to FIG. 9, a schematic diagram of a first summation circuit 130 in accordance with a first exemplary embodiment of summer 30 is shown. Summer 30 includes an R-2R ladder circuit with N-bit sampled input signals connected in parallel between resistors having resistance value R. As shown in the exemplary embodiment of FIG. 9, a first resistor 120, equal to 2R, is at a first end of the R-2R ladder circuit and is connected to ground. Bit 0 is provided through a first impedance 132 equal to 2R; bit N−1 is provided through a second impedance 130 equal to 2R; and Bit N is provided through a third impedance 128 equal to 2R. The output load resistance 126 is defined at the summer output port and is equal to 2R. A second resistor 122 is mounted between third impedance 128 and second impedance 130. A third resistor 124 is mounted between second impedance 130 and first impedance 132. Bit 0 is the least significant bit (LSB) and bit N is the most significant bit (MSB). The advantage of an R-2R ladder is that it uses only two different resistance values minimizing the errors of resistance values caused by process variations.

Figure 10:
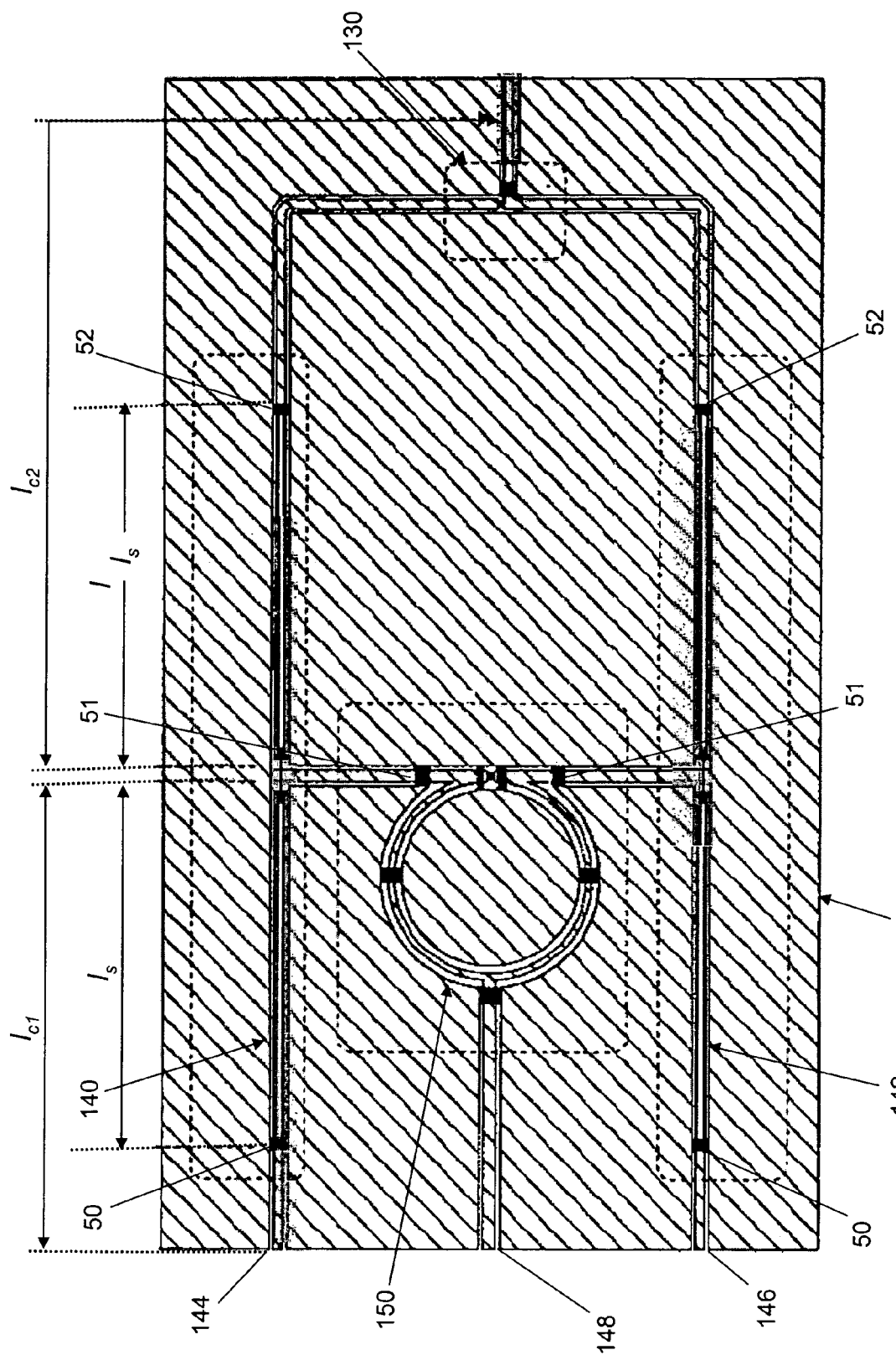
FIG. 10 is a layout of a first DAC design including the first sampler circuit design of FIG. 4 and the first summation circuit design of FIG. 9 in accordance with a first exemplary embodiment.

With reference to FIG. 10, a layout of a first DAC 160 in accordance with a first exemplary embodiment of DAC 26 is shown. First DAC 160 may include a MSB sampler circuit 140, a LSB sampler circuit 142, first summation circuit 130, and a power divider 150. MSB sampler circuit 140 and LSB sampler circuit 142 are implemented as first sampler circuit 40. In an exemplary embodiment, power divider 150 is implemented as a Wilkinson power divider. A MSB is provided at a first port 144 in electrical communication with MSB sampler circuit 140. A LSB is provided at a second port 146 electrical communication with LSB sampler circuit 142. The MSB and the LSB represent the digital signal to be sampled. A LO signal is provided at a third port 148 electrical communication with power divider 150. The LO signal is divided by power divider 150 and drives each sampler circuit 140, 142. Digital signals are sampled and added using first summation circuit 130. The total length of the R-2R circuit of first summation circuit 130 effects the performance of first DAC 160 because the reflected or transmitted waves are returned to sampler circuit 140, 142 and should arrive when the diodes are off to guarantee good impedance matching.

If, for example, the characteristic impedance of the CPW lines connected to first summation circuit 130 equal 50Ω and those lines replace the impedance of each bit 128, 132, resistance R of first summation circuit 130 should equal 25Ω. In this case, lumped resistors are used for R and CPW lines having the characteristic impedance $Z_0$ are used for 2R. In this example, the bit-0 signal is traveling along a transmission line. When the traveling wave meets first summation circuit 130, part of the power is reflected back to LSB sampler circuit 142, and the rest is transmitted to MSB sampler circuit 140 through the R-2R ladder. However, if every reflected and transmitted wave arrives at the samplers at a different time $t_k$ (k=0, 1, . . . , N), the waves may be reflected back to first summation circuit 130 a second time affecting the output analog signal if the sampler circuits 140, 142 provide insufficient impedance matching at the moment the waves arrive. There is additional margin due to the diode turn-on voltage, $V_t$. For GaAs Schottky diodes, $V_t$ is approximately 0.7 V. Until the LO signal reaches $V_t$, the diodes are off. The phase margin θ is defined when the LO signal applied to each sampler circuit 140, 142 has a peak voltage of $V_{peak}$. Because the phase margin can be taken from both rising and falling edges of a LO signal, the total margin is 2θ for a single cycle of the LO signal. Therefore, the length margin LM of the R-2R circuit can be expressed as shown below:

$$\theta(\text{rad}) = \arcsin(wt) = \frac{V_t}{V_{peak}} \quad (13)$$

$$LM = \frac{2\theta}{\lambda_{CPW}} = \frac{1}{\pi\lambda_{CPW}}\arcsin\left(\frac{V_t}{V_{peak}}\right). \quad (14)$$

Preferably, the length $l_{C1}$ and $l_{C2}$ indicated in FIG. 10 should be an odd multiple of $$\frac{\lambda_{CPW}}{4}$$

for CPW mode, and $l_s$ should be quarter-wave length for slotline mode. Because the sampler circuits 140, 142 work based on the different modes (CPW mode, slotline mode), the slotline mode length, $l_S$, should be defined separately. Thus, for improved connectivity, $$\frac{3\lambda_{CPW}}{4}$$

may be selected for $l_{C2}$, while $l_{C1}$ may be selected as $$\frac{\lambda_{CPW}}{4}.$$

Figure 11E:
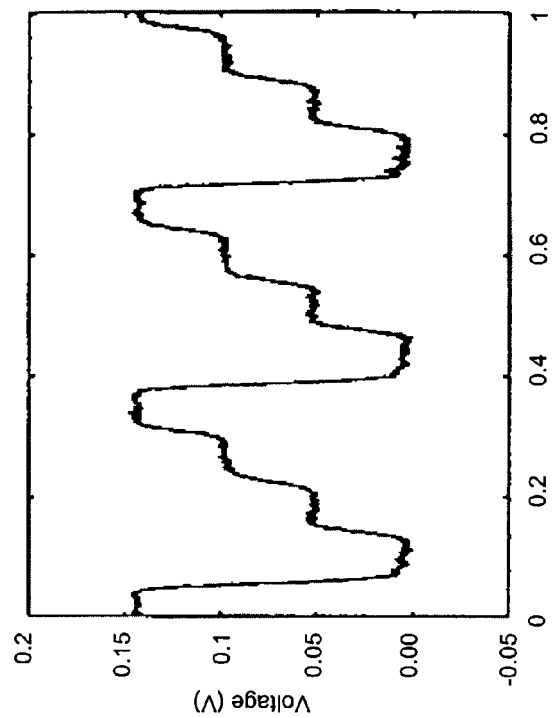
Figure 11D:
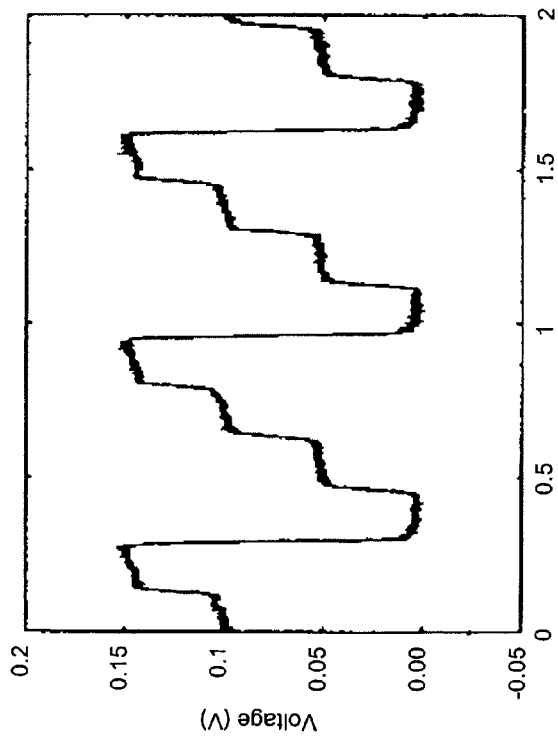
Figure 11F:
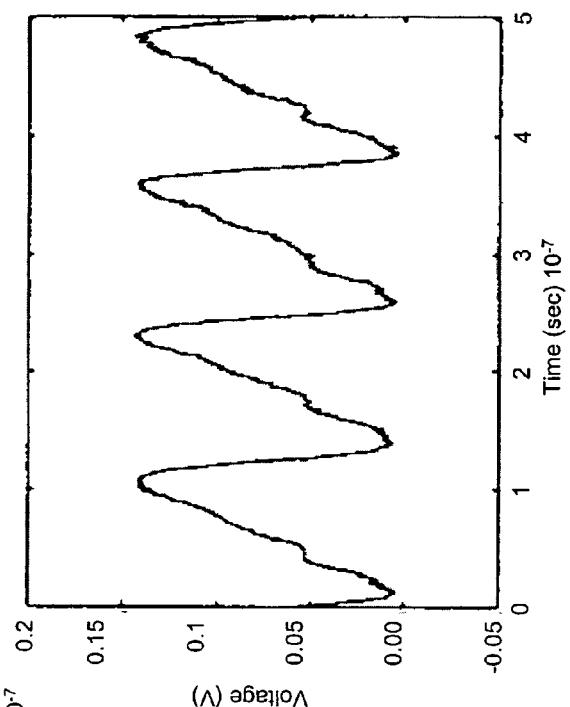

First DAC 160 was fabricated on RO3010 board made by Rogers corporation having $\in_r=10.2$ and a thickness=0.05 inches. In a test of first DAC 160, a 17 dBm, 1 GHz sinusoidal signal was applied to third port 148. To avoid aliasing, low-pass filter 34 with a bandwidth of 300 MHz was used. Additional, low pass filters having a bandwidth of 300 MHz were used at first port 144 and second port 146. FIGS. 11a-11h show various waveforms generated by the DAC. FIG. 11a shows a 15 MHz square wave. FIG. 11b shows a 30 MHz square wave. FIG. 11c shows a 80 MHz square wave. FIG. 11d shows a 15 MHz sawtooth wave. FIG. 11e shows a 30 MHz sawtooth wave. FIG. 11f shows a 80 MHz sawtooth wave. FIG. 11g shows a 200 MHz sine wave. FIG. 11h shows a DC wave.

First DAC 160 is scalable to microwave frequencies. The resolution of first DAC 160 depends on the accuracy of the resistors, especially in first summation circuit 130. The physical size of the resistors can be determined by considering the power and the operating frequency of the DAC. The length of the resistors may be more important as the number of bits and the operating frequency increase. Although a narrower or thinner resistor has higher sheet resistance and needs shorter length for a certain resistance value, it can handle less power. Thus, a trade-off may be necessary.

Figure 12:
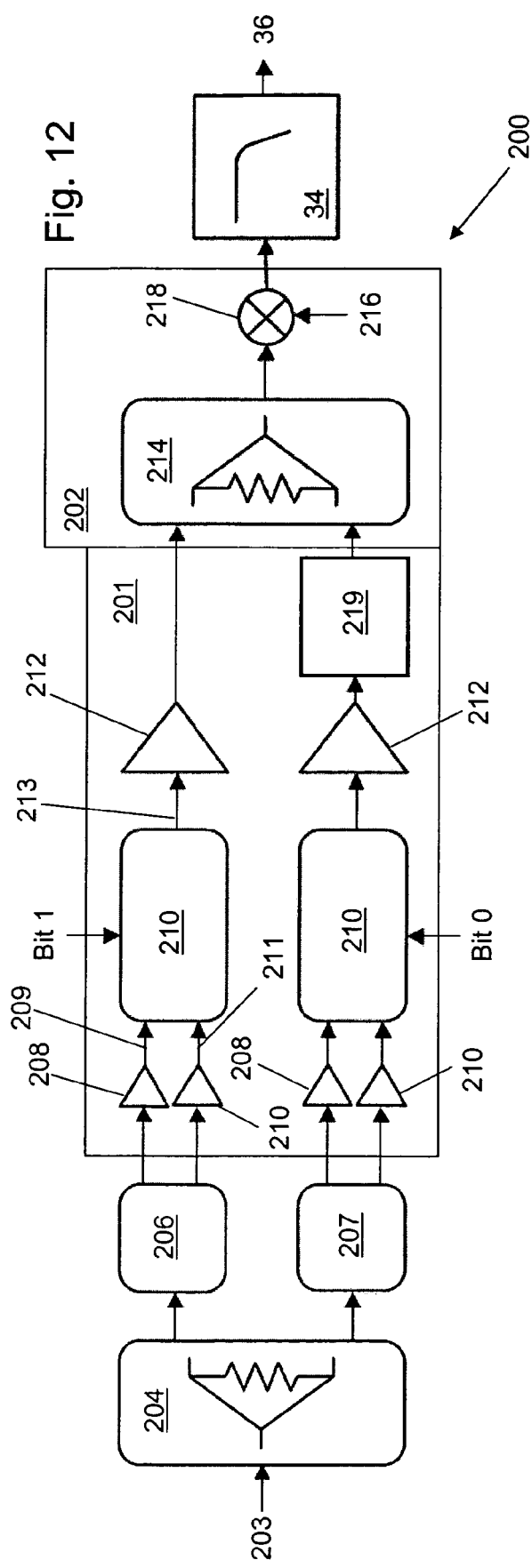
FIG. 12 is a block diagram of a second DAC design in accordance with a second exemplary embodiment.
Figure 13:
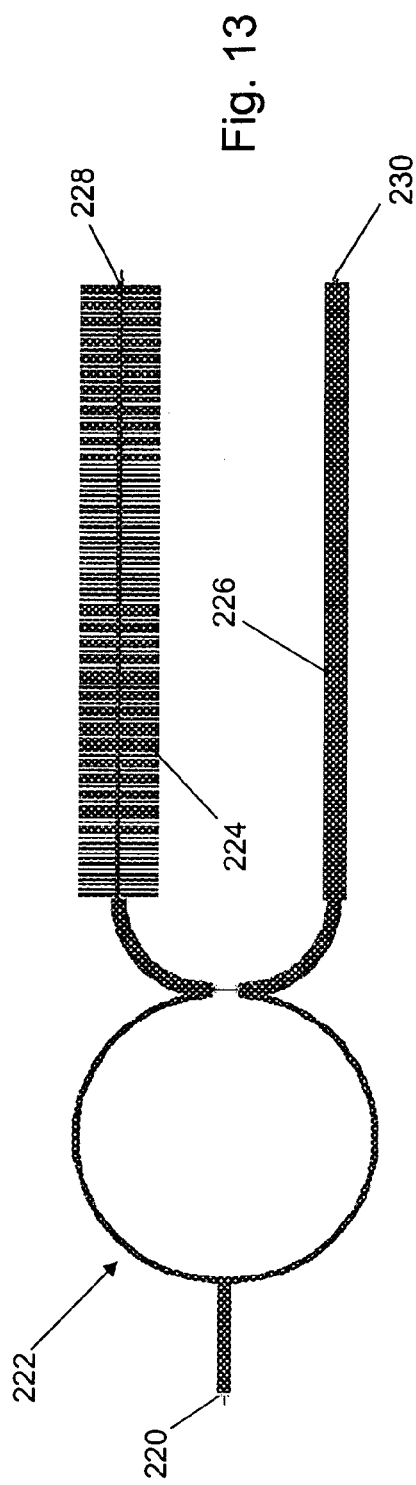
FIG. 13 is a layout of a balun used in the second DAC design of FIG. 12 in accordance with an exemplary embodiment.

With reference to FIG. 12, a schematic diagram of a second DAC 200 in accordance with a second exemplary embodiment of DAC 26 is shown. Second DAC 200 may include a power divider 204, a MSB balun 206, a LSB balun 207, a second sampler circuit 201, a second summation circuit 202, and low pass filter 34. A continuous wave (CW) input signal source 203 is provided to power divider 204. Second sampler circuit 201 includes 4-diode samplers, called choppers, that work as switches to pass or reject rectified sinusoidal signals. Second sampler circuit 201 uses balanced signals that have a 180° phase difference. In an exemplary embodiment, baluns 206, 207 are formed of microstrip lines. Exemplary baluns 206, 207 are shown with reference to FIG. 13 composed of a balun power divider 222, a first delay line 224, and a second delay line 226. Balun power divider 222 receives a signal 220 from power divider 204 which is divided between first delay line 224 and second delay line 226. A first signal 228 is formed from propagation through first delay line 224. A second signal 230 is formed from propagation through second delay line 226. Second signal 230 is 180° out of phase with first signal 228. To avoid parasitics caused by bending the lines and to save area, slow-wave microstrip lines may be used to form baluns 206, 207. From Equations (15), (16) and (17), it follows that the wavelength can be made small while the characteristic impedance is kept unchanged by increasing L and C with the same ratio.

$$Z_0 = \sqrt{\frac{L}{C}} \quad (15)$$

$$\lambda = \frac{v_p}{f} \quad (16)$$

$$v_p = \frac{1}{\sqrt{LC}} \quad (17)$$

Second sampler circuit 201 may include a first buffer amplifier 208 receiving first signal 228, a second buffer amplifier 210 receiving second signal 230, a diode sampler circuit 210, and a third buffer amplifier 212 for each bit of the plurality of bits of the digital signal. Diode sampler circuit 210 receives a first amplified signal 209, a second amplified signal 211, and a bit of the plurality of bits. Diode sampler circuit 210 forms a sampled signal 213 input to third buffer amplifier 212.

Figure 14:
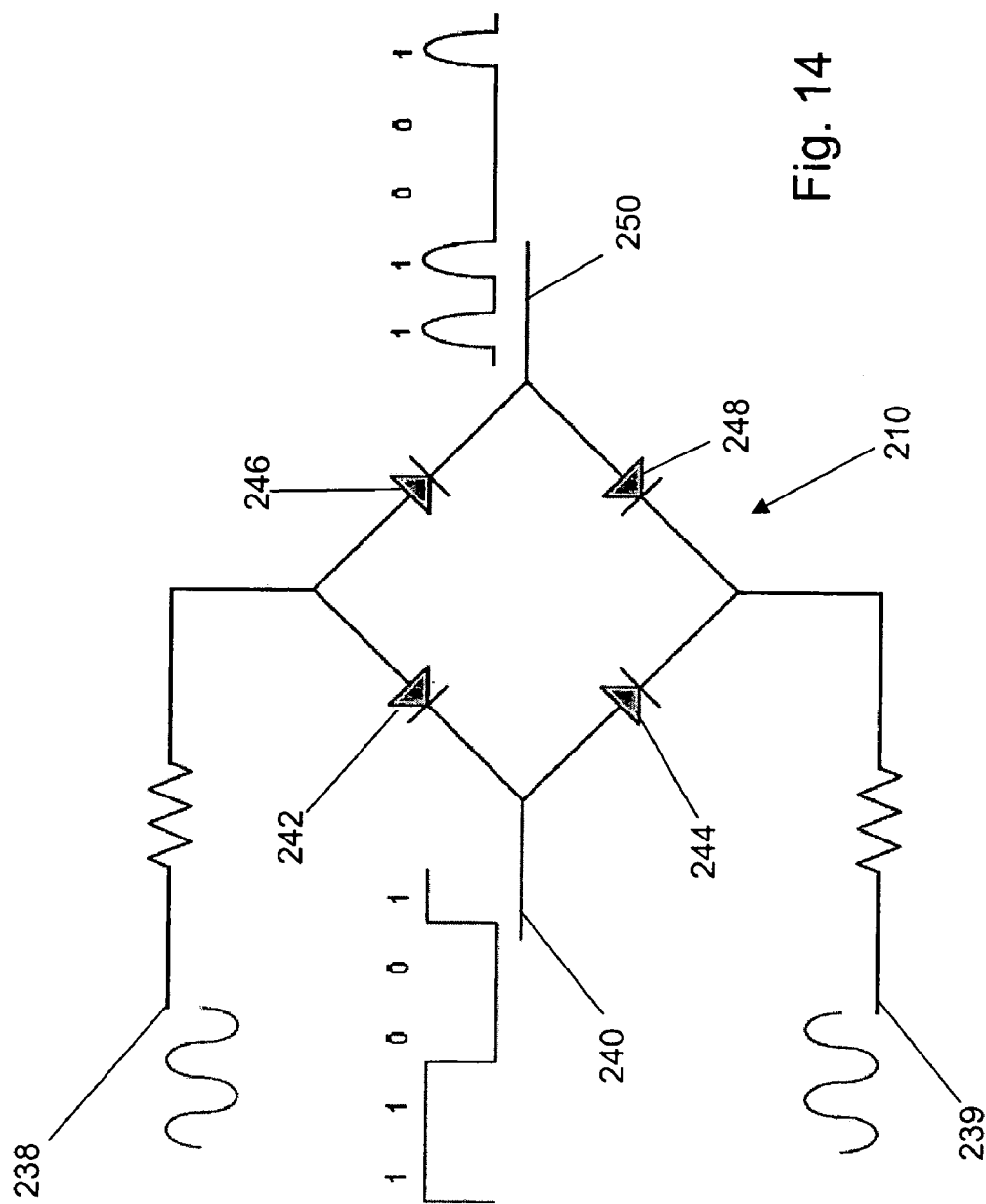
FIG. 14 is a schematic diagram of a second sampler circuit design used in the second DAC design of FIG. 12 in accordance with an exemplary embodiment.

With reference to FIG. 14, diode sampler circuit 210 includes an input signal port 240, a first port 238, a second port 239, an output port 250, and a plurality of diodes. Input signal port 240 receives the bit from the digital signal source 22. First port 238 receives first amplified signal 209. Second port 239 receives second amplified signal 211. Output port 250 propagates sampled signal 213 to second summation circuit 202. In the exemplary embodiment, the plurality of diodes include a first diode 242, a second diode 244, a third diode 246, and a fourth diode 248. First diode 242 connects between first port 238 and input signal port 240. Second diode 244 connects between input signal port 240 and second port 239. Third diode 246 connects between first port 238 and output port 250. Fourth diode 248 connects between output port 250 and second port 239. In an exemplary embodiment, the plurality of diodes 242, 244, 246, 248 are Schottky diodes. In another exemplary embodiment, the plurality of diodes 242, 244, 246, 248 are GaAs Schottky diodes When CW input signal source 203 is negative, all of the plurality of diodes are turned off regardless of the value of the bit received from digital signal source 22. As a result, sampled signal 213 is at ground potential. When CW input signal source 203 is positive, the voltage level of sampled signal 213 depends on the value of the bit received from digital signal source 22. As a result, when driven by balanced sinusoidal signals, the output of diode sampler circuit 210 is a train of half sinusoidal signals which are turned on and off in accordance with the input bit stream. The input/output impedance matching of diode sampler circuit 210 is poor potentially corrupting the analog output signal. To avoid this, buffer amplifiers 208, 210, 212 should have broadband impedance matching. Because the reflected power from diode sampler circuit 210 is absorbed at buffer amplifiers 208, 210, 212, the reflected power does not affect the analog output signal. In the exemplary 2-bit DAC of FIG. 12, Bit 1 is the MSB and Bit 0 is the LSB. The LSB signal is attenuated by an attenuator 212 to make the voltage ratio between the MSB and the LSB two.

The sampled signals are added by second summation circuit 202. Second summation circuit 202 may include a power combiner 214 and a mixer 218. Preferably, power combiner 214 is broadband to add signals without distortion. However, it is very difficult to make a power combiner that covers a bandwidth from DC to high frequencies, especially using waveguide structures. Selecting a higher frequency band whose center frequency is $\omega_0$, $2\omega_0$, or higher can solve this problem. In an exemplary embodiment, power combiner 214 is a three section Wilkinson power combiner having a bandwidth sufficient to add the frequency components needed to recover f(t). The Fourier series representation for a half-sinusoidal wave is shown in Equation (18).

$$f(t) = \frac{1}{\pi} + \frac{1}{2}\sin(\omega_0 t) - \sum \left(\frac{2}{\pi}\right)\left(\frac{1}{n^2-1}\right)\cos(n\omega_0 t) \quad k \in 2, 4, 6, \ldots \quad (18)$$

Mixer 218 receives a LO signal at a first port 216. The center frequency of power combiner 214 is determined by the LO frequency of mixer 218. After summation, the added signal is down-converted to zero frequency using mixer 218. f(t) is retrieved using low pass filter 34. As is shown in Equation (18), most of the power of a half-sinusoidal signal exists at frequency $\omega_0$ and $2\omega_0$. Therefore, to achieve a large output signal-to-noise ratio, the LO frequency of the mixer should be either $\omega_0$ and $2\omega_0$. Although using $\omega_0$ can produce larger output signal power, $2\omega_0$ may be a better choice if port isolation of diode sampler circuit 210 is insufficient.

Figure 15A:
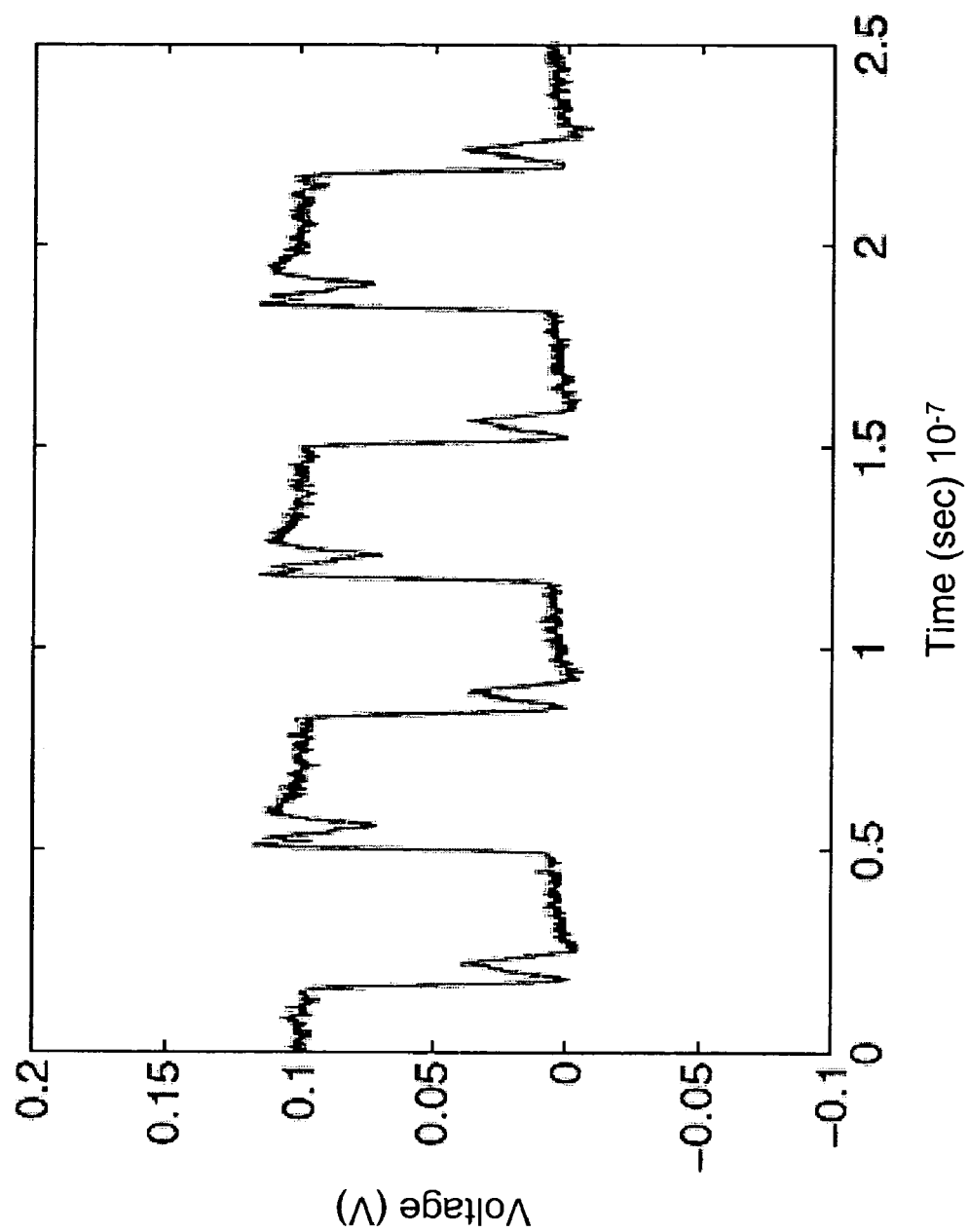
FIGS. 15a-15d are graphs illustrating a variety of waveforms generated by the second DAC design of FIG. 12.
Figure 15B:
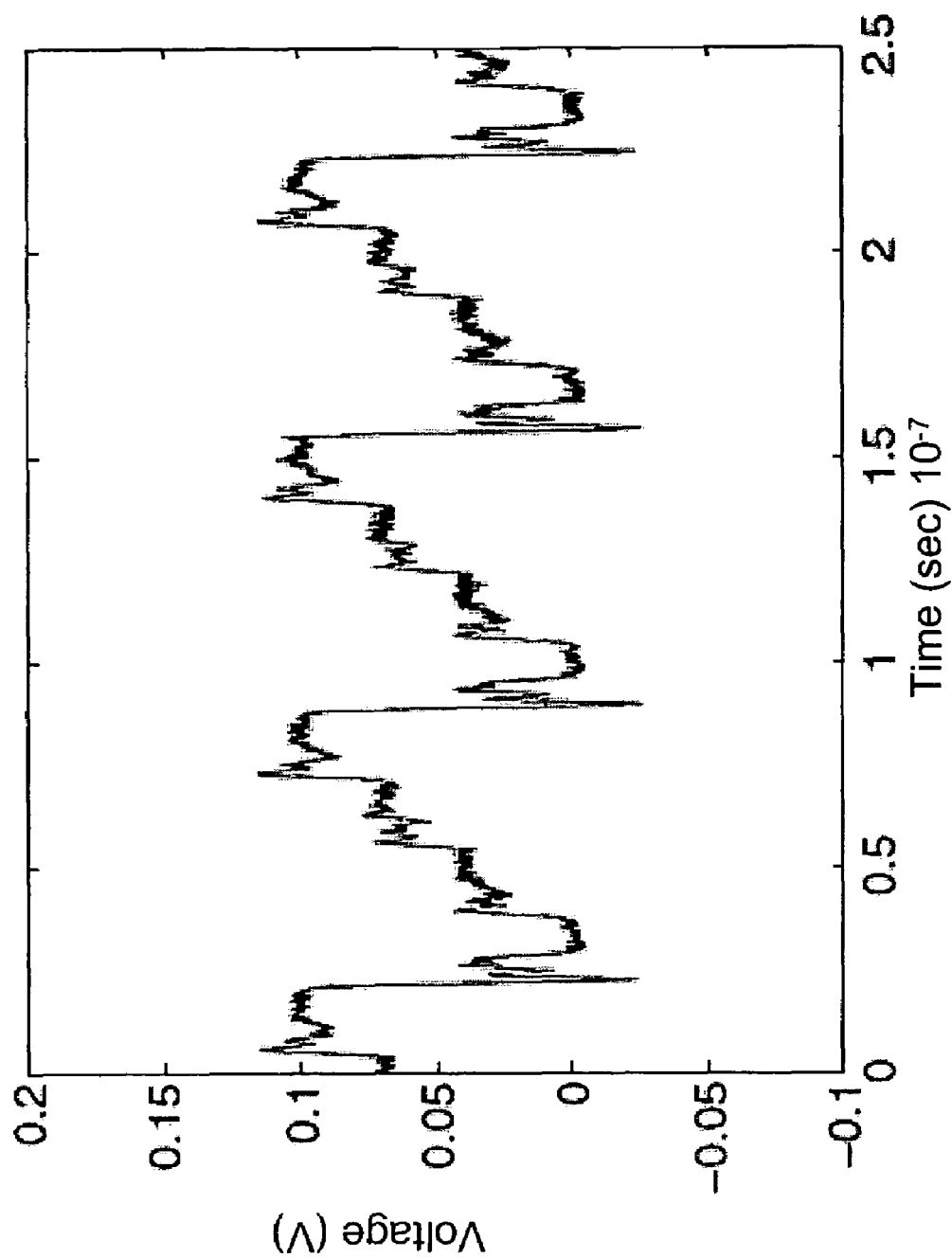
Figure 15C:
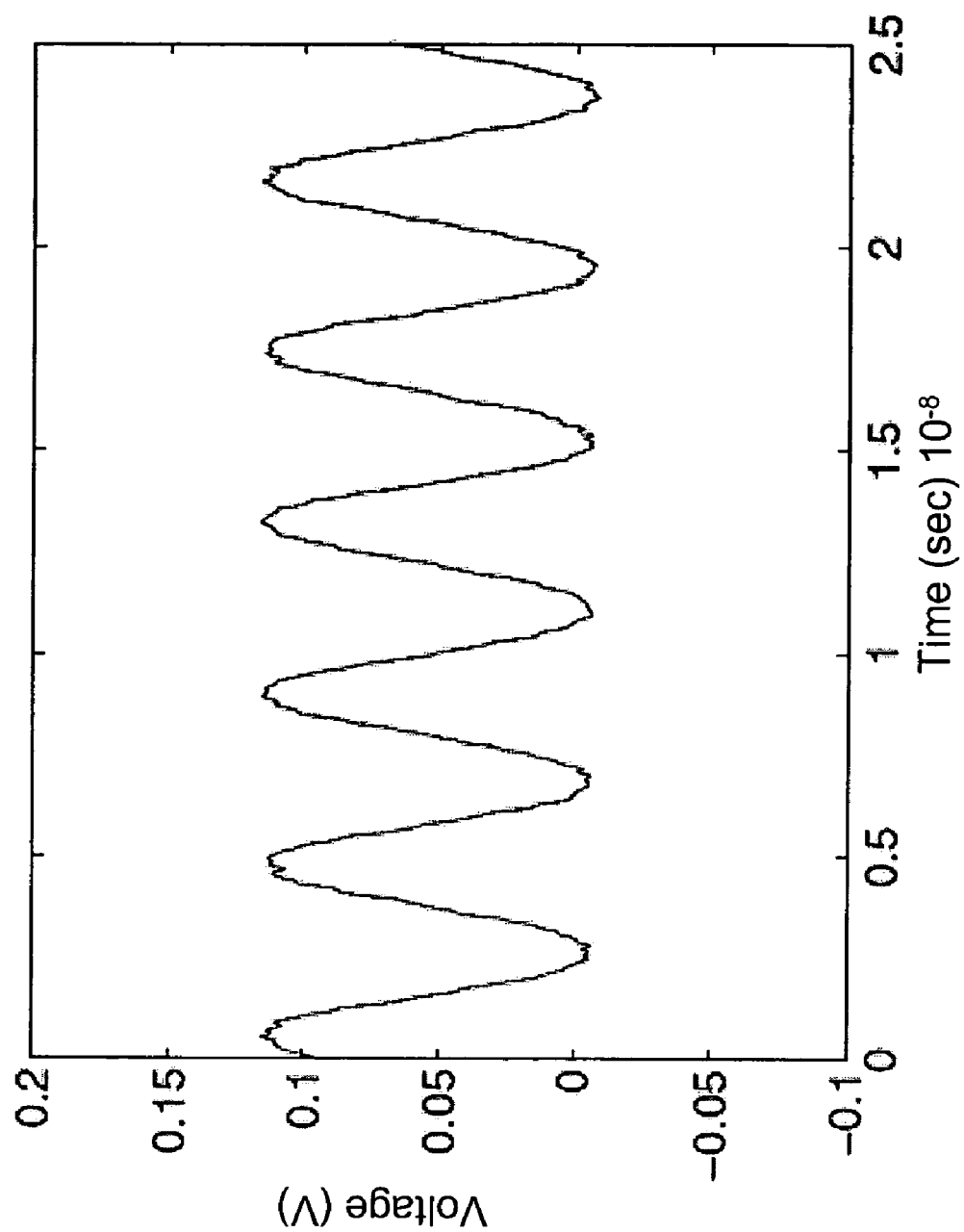
Figure 15D:
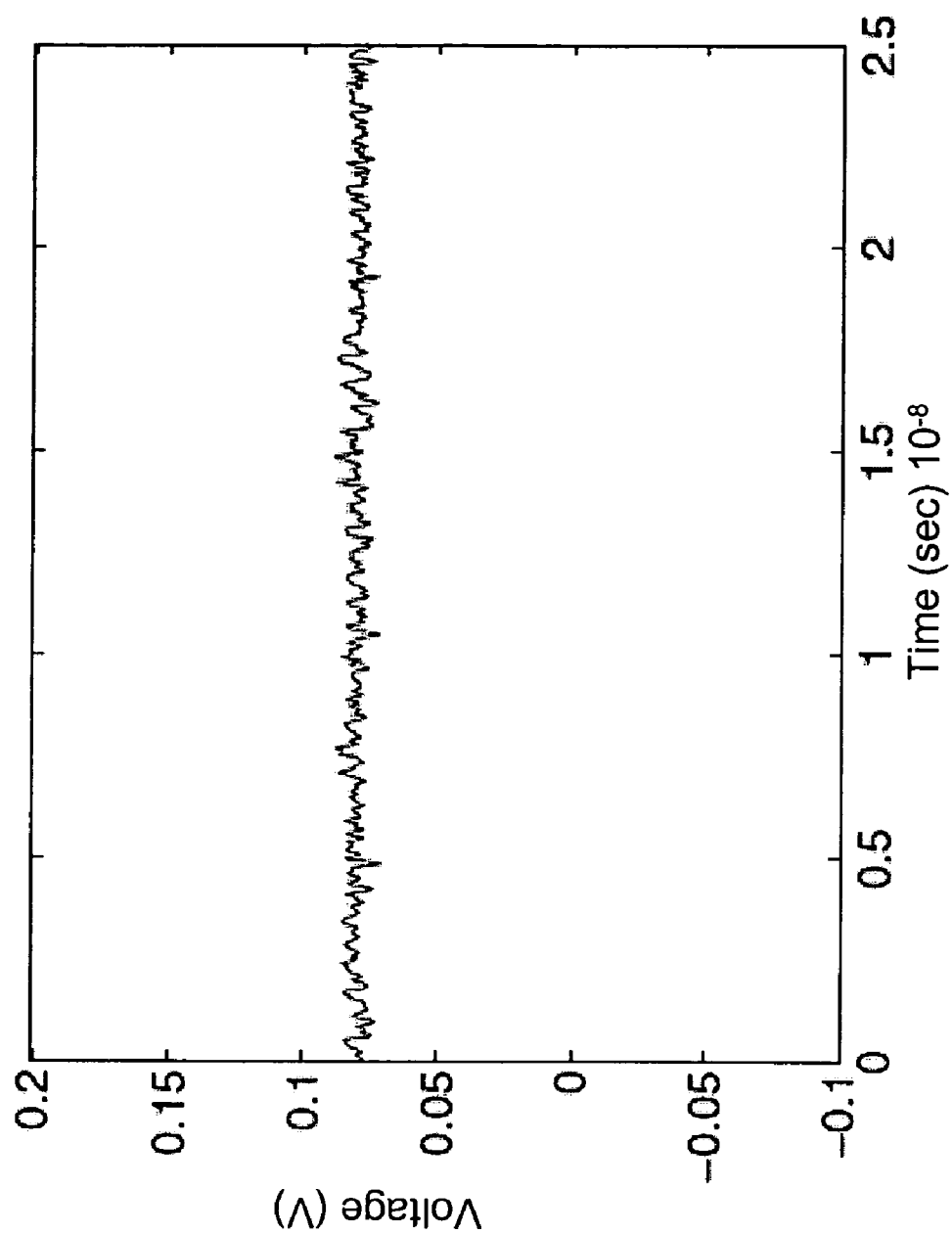

Second DAC 200 was fabricated on RO3010 board made by Rogers corporation having $\in_r$=10.2 and a thickness=0.05 inches. Each circuit component was made on a separate board and connected through cables or adapters. To avoid aliasing, low-pass filter 34 with a bandwidth of 300 MHz was used. FIGS. 15a-15d show various waveforms generated by second DAC 200. FIG. 15a shows a 15 MHz square wave. FIG. 15b shows a 15 MHz sawtooth wave. FIG. 15c shows a 235 MHz sine wave. FIG. 15d shows a DC wave.

The foregoing description of exemplary embodiments of the invention have been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A digital-to-analog converter, the converter comprising:
a plurality of sampler circuits in electrical communication with a digital signal source, a sampler circuit of the plurality of sampler circuits adapted to sample a bit of a plurality of bits from the digital signal source with a half-sinusoidal signal thereby forming a sampled signal; and
a summation circuit in electrical communication with the plurality of sampler circuits, the summation circuit adapted to combine the sampled signal from each of the plurality of sampler circuits thereby forming an analog signal portion representative of the plurality of bits.

2. The converter of claim 1, wherein the sampler further comprises:
a plurality of diodes; and
a sinusoidal signal source wherein the sinusoidal signal source toggles the plurality of diodes on and off thereby forming the sampled signal at a sampler output port.

3. The converter of claim 2, wherein the summation circuit comprises an R-2R resistance ladder circuit.

4. The converter of claim 2, wherein a least significant bit of the plurality of bits is closest to a load resistance of the R-2R resistance ladder circuit.

5. The converter of claim 3, wherein the sampler further comprises:
an input port in electrical communication with the digital signal source;
a first coplanar wave guide connected between the input port and the plurality of diodes; and
a second coplanar wave guide connected between the plurality of diodes and the sampler output port.

6. The converter of claim 5, wherein the first coplanar wave guide has a double center line.

7. The converter of claim 5, wherein the length of the first coplanar wave guide is an odd multiple of $$\frac{\lambda_{CPW}}{4},$$

where $\lambda_{CPW}$ is the wavelength of the coplanar wave guide.

8. The converter of claim 7, wherein a length margin of the R-2R resistance ladder circuit is expressed as $$\frac{1}{\pi \lambda_{CPW}}$$

arcsin $$\left(\frac{V_t}{V_{peak}}\right)$$

where $V_t$ is the turn-on voltage of the diode, and $V_{peak}$ is the peak voltage of the sinusoidal signal source.

9. The converter of claim 5, wherein the sampler further comprises:
a first resistor connected between a first terminal of the sinusoidal signal source and a first diode of the plurality of diodes;
a second resistor connected between a second diode of the plurality of diodes and a second terminal of the sinusoidal signal source, wherein the first diode and the second diode are connected in series;
a third resistor connected between the first terminal of the sinusoidal signal source and a third diode of the plurality of diodes;
a fourth resistor connected between a fourth diode of the plurality of diodes and the second terminal of the sinusoidal signal source, wherein the third diode and the fourth diode are connected in series.

10. The converter of claim 9, wherein a first input impedance of the sampler is $$\frac{R}{4} \| Z_0,$$

where R is a resistance of the first resistor, the second resistor, the third resistor, and the fourth resistor, and $Z_0$ is an impedance of the first coplanar wave guide and the second coplanar wave guide.

11. The converter of claim 10, wherein the first input impedance results when the plurality of diodes are toggled on.

12. The converter of claim 10, wherein R is approximately equal to $2Z_0$.

13. The converter of claim 10, wherein a second input impedance of the sampler is $$\frac{R}{2}.$$

14. The converter of claim 10, wherein the second input impedance results when the plurality of diodes are toggled off.

15. The converter of claim 4, wherein a diode of the plurality of diodes is a Schottky diode.

16. The converter of claim 15, wherein the Schottky diode is a GaAs Schottky diode.

17. The converter of claim 1, further comprising a low pass filter adapted to receive the analog signal portion and to limit the bandwidth of an analog signal output from the low pass filter.

18. The converter of claim 2, wherein the sinusoidal signal source comprises a power divider that connects with the plurality of sampler circuits.

19. The converter of claim 2, wherein the summation circuit further comprises a Wilkinson power combiner circuit.

20. The converter of claim 19, wherein the sinusoidal signal source wherein the sinusoidal signal source provides a first signal and a second signal, the second signal 180 degrees out of phase with the first signal.

21. A method of converting a digital signal to an analog signal, the method comprising:
receiving a plurality of bits from a digital signal source;
sampling the plurality of bits with a half-sinusoidal signal at a plurality of sampler circuits thereby forming a plurality of sampled signals; and
summing the plurality of sampled signals using a summation circuit.

22. A discrete digital synthesizer, the synthesizer comprising:
a digital signal source;
a plurality of sampler circuits in electrical communication with the digital signal source, a sampler circuit of the plurality of sampler circuits adapted to sample a bit of a plurality of bits from the digital signal source with a half-sinusoidal signal thereby forming a sampled signal;
a summation circuit in electrical communication with the plurality of sampler circuits, the summation circuit adapted to combine the sampled signal from each of the plurality of sampler circuits thereby forming an analog signal portion representative of the plurality of bits; and
an analog signal receiver in electrical communication with the summation circuit to receive the analog signal portion.

* * * * *